United States Patent [19]
Matsuoka et al.

[11] Patent Number: 5,885,101
[45] Date of Patent: Mar. 23, 1999

[54] IC CARRIER

[75] Inventors: Noriyuki Matsuoka, Yokohama; Kazumi Uratsuji, Tokyo, both of Japan

[73] Assignee: Yamaichi Electronics Co., Ltd., Tokyo, Japan

[21] Appl. No.: 692,066

[22] Filed: Aug. 7, 1996

[30] Foreign Application Priority Data

Aug. 11, 1995 [JP] Japan ................................ 7-227245

[51] Int. Cl.⁶ ....................................................... H05K 1/00
[52] U.S. Cl. ................................................ 439/526; 439/73
[58] Field of Search ................................ 439/68, 73, 330, 439/331, 526

[56] References Cited

U.S. PATENT DOCUMENTS 4,547,794 10/1985 Tang .
4,597,617 7/1986 Enochs .
4,937,108 6/1990 Crisp et al. ................................. 428/13
5,009,608 4/1991 Shipe ........................................ 439/331
5,109,980 5/1992 Matsuoka et al. ........................ 206/328

*Primary Examiner*—Khiem Nguyen
*Assistant Examiner*—Eugene Byrd
*Attorney, Agent, or Firm*—Wenderoth, Lind & Ponack, L.L.P.

[57] ABSTRACT

An IC carrier includes a carrier base, a carrier cover and a wiring sheet, through which an IC and a socket contact each other, interposed between the carrier cover and the wiring sheet. The IC is retained by the carrier base such that the IC and the wiring sheet face each other. The IC carrier further includes a plurality of connecting pins projecting from an opposing surface of one of the carrier base and the carrier cover. The connecting pins are inserted into through-holes formed in the wiring sheet and then press fitted into connecting holes formed in the other of the carrier base and the cover, so that an area in the vicinity of a peripheral edge of the wiring sheet is sandwiched between the carrier base and the carrier cover.

16 Claims, 8 Drawing Sheets

IC CARRIER

BACKGROUND OF THE INVENTION

1. Field of the Invention

This invention relates to an IC carrier for retaining a wiring sheet and an IC in their opposed relation.

2. Brief Description of the Prior Art

In U.S. Pat. No. 4,547,794, U.S. Pat. No. 4,597,617, U.S. Pat. No. 4,937,108 and U.S. Pat. No. 5,109,980, a carrier base carrying an IC thereon is provided with positioning pins for correctly positioning a flexible wiring sheet. The flexible wiring sheet is provided with positioning holes. By correctly inserting the positioning pins into corresponding positioning holes of the flexible wiring sheet, relative positions of the carrier base and the flexible wiring sheet are established. The flexible wiring sheet is sandwiched between the base and a clip-type beam, a carrier cover or the like, so that a correct position of the flexible wiring sheet is maintained.

However, the above-mentioned conventional IC carriers have the following problem. When the positioning pins are inserted into corresponding positioning holes, the pins are caused to press the inner walls of the positioning holes due to manufacturing tolerances of the positioning pins of the carrier body and the positioning holes of the flexible wiring sheet. Consequently, the flexible wiring sheet tends to move slightly. As a consequence, the contact position of the flexible wiring sheet is displaced with respect to the IC held by the carrier base.

Since the flexible wiring sheet in its displaced position is sandwiched between the base and the clip or the carrier cover, the flexible wiring sheet remains in its displaced state. Accordingly, the positioning pins cannot fully exhibit their intrinsic positioning functions.

In order to maintain a correct relative position between the IC and the flexible wiring sheet, it is required that the flexible wiring sheet is firmly sandwiched between the carrier base and the carrier cover so that the flexible wiring sheet will not move even slightly. It is demanded that this problem be solved without the provision of a complicated construction (namely by maintaining a simple construction).

The present invention has been accomplished in view of the above problem.

SUMMARY OF THE INVENTION

It is, therefore, a general object of the present invention to provide an IC carrier which is capable of solving the above-mentioned problem inherent in the conventional devices.

To achieve the above object, there is essentially provided an IC carrier comprising a carrier base, a carrier cover, and a wiring sheet, through which an IC and a socket contact each other, interposed between the carrier cover and the wiring sheet. The IC being is retained by the carrier base such that the IC and the wiring sheet face each other. The IC carrier further comprises a plurality of connecting pins projecting from an opposing surface of one of the carrier base and the carrier cover. The connecting pins are inserted into through-holes formed in the wiring sheet and then press fitted into connecting holes formed in the other of the carrier base and the carrier cover, so that an area in the vicinity of a peripheral edge of the wiring sheet is sandwiched between the carrier base and the carrier cover.

Owing to the above-mentioned construction, the connecting pins provided on an opposing surface of the one of the carrier cover and the carrier base are press fitted into the connecting holes formed in a counter surface of the other of the carrier case and carrier base, so that the peripheral edge portions of the wiring sheet can firmly be sandwiched between the base and the cover. Furthermore, the carrier cover and the base can be joined together by one action for closing the carrier cover with respect to the carrier base to press the carrier base.

It is preferred that the peripheral edge portion of the wiring sheet is expanded from a peripheral edge portion of the carrier cover, and a contact pad to be contacted with contacts arranged on the peripheral edge portion of the wiring sheet is arranged along an outer side of a peripheral edge portion of the cover.

The diameter of each of the through-holes is preferably larger than that of each of the connecting pins.

The plurality of connecting pins, through-holes and connecting holes may be arranged on each diagonal line of an assembly of the carrier base, wiring sheet and carrier cover.

It is preferred that each corner portion of the carrier base is provided with a positioning hole for allowing a corresponding positioning pin of the socket to be inserted therein.

It is also preferred that the wiring sheet is bonded to a backup frame, each frame of the backup frame supports the peripheral edge portion of the wiring sheet, and a contact pad to be contacted with the contacts of the socket is arranged on the peripheral edge portion of the wiring sheet.

Each corner portion of the backup frame is preferably provided with a positioning hole for allowing a corresponding positioning pin of the socket to be inserted therein.

The above and other objects of this invention will become more readily apparent from a review of the following description, with reference to the accompanying drawings.

DETAILED DESCRIPTION OF THE EMBODIMENT

Figure 1:
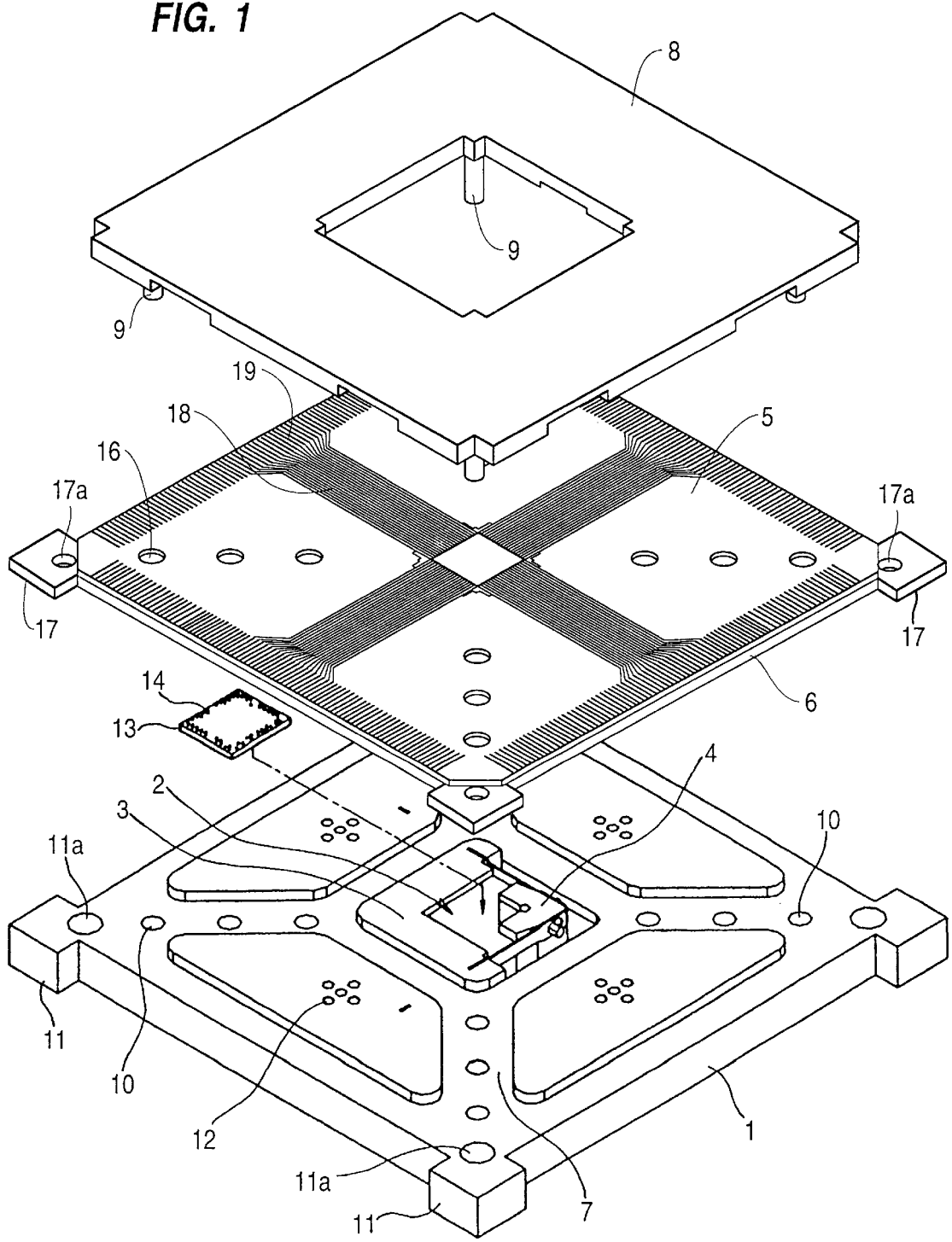
FIG. 1 is an exploded perspective view of a carrier base, a flexible wiring sheet and a carrier cover.

One embodiment of the present invention will now be described in detail with reference to FIGS. 1 through 12 of the accompanying drawings.

As shown in FIGS. 1, 2, 11 and 12, a carrier base 1 is made of an insulative material and has a flat square shape.

The carrier base 1 includes a generally square IC receiving portion 2 disposed at a generally central portion of one of its surfaces. One corner portion, of a pair of opposing corner portions of the IC receiving portion 2, is formed with a reference corner ruler 3 for restricting one corner portion of an IC 13, whereas the other corner portion of the IC receiving portion 2 resiliently retains a movable corner ruler 4. This movable corner ruler 4 is adapted to resiliently press the IC 13 towards the reference corner ruler 3.

A backup frame receiving portion 7 is formed in a stepped-fashion on the surface of the carrier base 1 not only at an area defined by the periphery of the IC receiving portion 2 and the outer peripheral edge of the carrier base 1 but also at an area on and in the vicinity of each diagonal line of the carrier base 1. The backup frame receiving portions 7 are each adapted to receive a backup frame 6 of a flexible wiring sheet 5 as later described. The backup frame receiving portion 7 is provided at the bottom surfaces along its diagonally extending portions with connecting holes 10 into which connecting pins 9, as later described, are to be press fitted. Each corner portion of the carrier base 1 is provided with a positioning hole 11a into which a corresponding positioning pin 20 (see FIG. 7) of a socket 22 to be subjected to a burn-in test or the like is to be inserted with this carrier assembly loaded thereon.

A positioning piece 11 projecting from each corner portion of the flexible wiring sheet 5 is formed on each corner portion of the carrier base 1, and this positioning piece 11 is provided with the above positioning hole 11a.

A plurality of suction holes 12 are formed between each side of the carrier base 1 and the IC receiving portion 2. That is, the suction holes 12 are arranged in an area around the IC receiving portion 2 at equal spaces.

The outer configuration of the IC 13 is square. The IC 13 has a plurality of contact pieces 14 arranged in array on its surface. Bumps 15 of the flexible wiring sheet 5 to be described next are superimposed on those contact pieces 14 for electrical connection.

Figure 9:
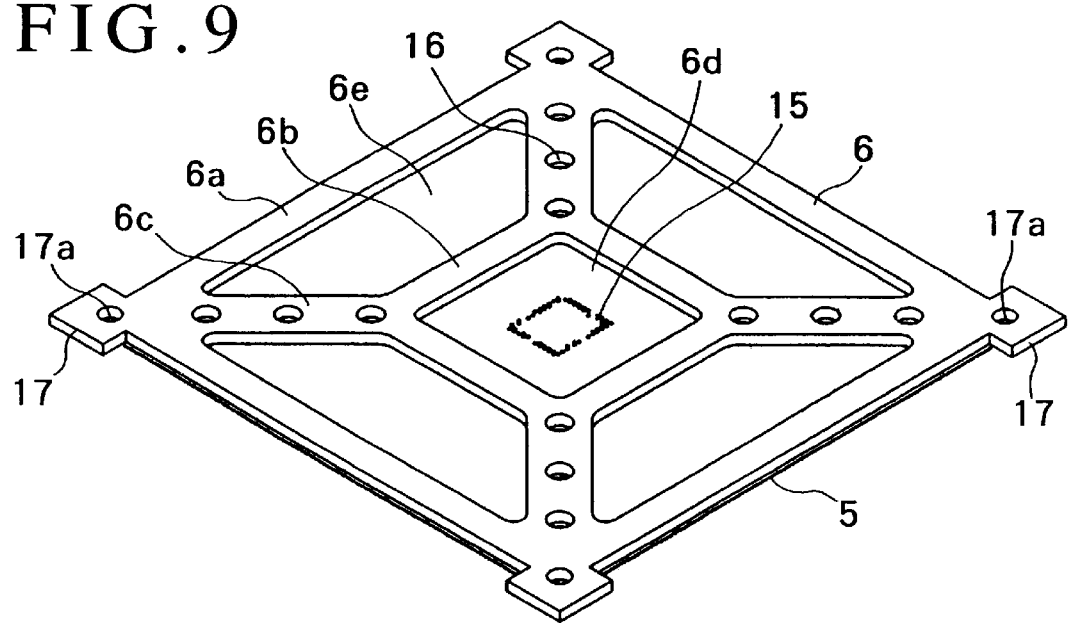
FIG. 9 is a perspective view in which the wiring sheet is viewed from the inner surface side.
Figure 10:
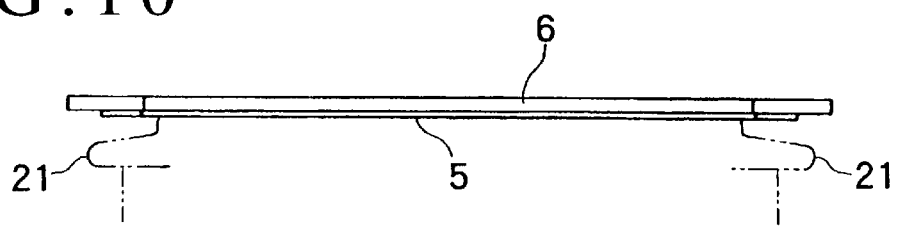
FIG. 10 is a side view of the wiring sheet.

On the other hand, the flexible wiring sheet 5, as shown in FIGS. 1, 9 and 10, is made of an insulative material having flexibility such as, for example, synthetic resin film. The flexible wiring sheet 5 is provided on its surface with the conductive bumps 15 corresponding to the contact pieces 14 of the IC 13. Lead patterns 18 having conductivity are formed from each bump 15 towards each side of the flexible wiring sheet 5. A contact pad 19 to be contacted with the contacts 21 (see FIGS. 5 and 10) of the socket 22 is formed on the lead patterns 18.

Specifically, the lead patterns 18 extend in parallel relation from the central portion of the wiring sheet 5 towards the outer edge portion. The bump 15 is formed on an inner end of each lead pattern 18 and the contact pad 19 is formed on an outer end thereof. The bumps 15 are arranged at the central portion of the wiring sheet 5, and the contact pads 19 are arranged along each side edge of the wiring sheet 5.

The backup frame 6 having a comparatively strong rigidity is adhered to the flexible wiring sheet 5 through an adhesive agent, thus exhibiting a structure of a laminated plate.

The backup frame 6 includes an outer frame 6a (pressure frame) extending along the four sides thereof, an inner frame 6b extending along the four sides of the IC receiving portion 2, and a connecting frame 6c extending between a corner portion of each outer frame 6a and a corner portion of each inner frame 6b and interconnecting the inner and outer frames 6a and 6b. The flexible wiring sheet 5 is adhered to the surfaces of the frames 6a, 6b and 6c to provide rigidity.

An IC receiving window 6d is defined by the inner frame 6b. The wiring sheet 5 covers one open surface of the IC receiving window 6d, with the bumps 15 exposed within the window. The flexible wiring sheet 5 can be formed of a wiring board having a comparatively stronger rigidity than a film or the like.

A plurality of through-holes 16, which are open to the surface of each connecting frame 6c, are formed in the flexible wiring sheet 5 and backup frame 6. Those through-holes 16 correspond to the connecting holes 10 of the carrier base 1 and are arranged on each diagonal line of the backup frame 6.

Positioning holes 17a corresponding to the above positioning holes 11a are each formed in each corner portion of the backup frame 6. That is, each corner portion of the backup frame 6 is provided with a positioning piece 17 projecting from each corner portion, and the positioning hole 17a is formed in this positioning piece 17. The positioning pieces 11 and 17 are overlapped with each other, and the positioning holes 11a and 17a are aligned with each other. Positioning pins of the socket extending through the positioning holes 11a are inserted into the corresponding positioning holes 17a.

The diameter of each through-hole 16 is larger than that of each connecting hole 10, whereas the diameter of each positioning hole 17a is smaller than that of each positioning hole 11a. Owing to the feature that the through-holes 16 are larger in diameter than the connecting holes 10, the connecting pins 9 as later described are prevented from contacting the inner walls of the through-holes 16 when the connecting pins 9 are press fitted into the corresponding connecting holes 10 through the through-holes 16. As a consequence, the wiring sheet 5 can be prevented from being displaced.

Figure 8:
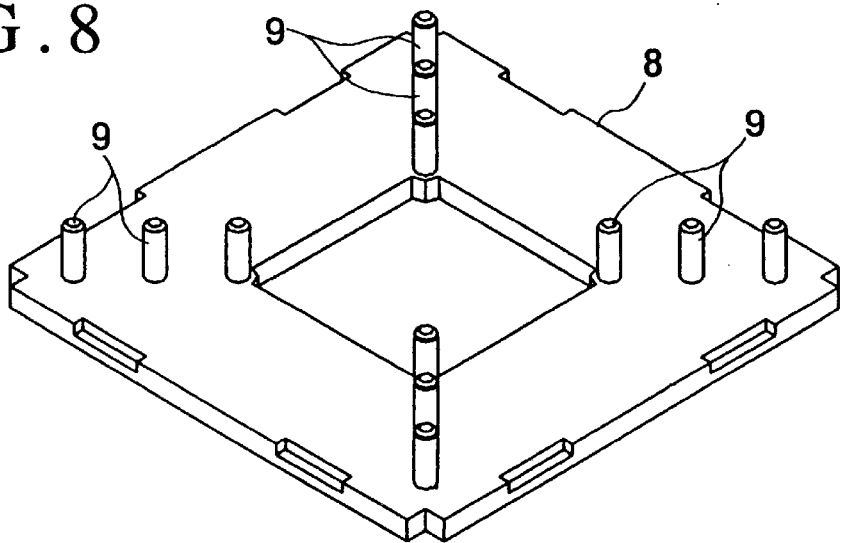
FIG. 8 is a perspective view in which the carrier cover is viewed from the inner surface side.

On the other hand, as shown in FIGS. 1 and 8, the carrier cover 8 is made of an insulative material, and has a flat and square shape. The carrier cover 8 is provided on one surface thereof with the connecting pins 9 arranged on its diagonal lines and projecting therefrom. Those connecting pins 9 are adapted to be press fitted into corresponding connecting holes 10 of the carrier base 1. Distal ends of the connecting pins 9 are tapered. The length of each connecting pin 9 is dimensioned such that the connecting pins 9 will not project from the back surface of the carrier base 1 when the carrier cover 8 is closed with respect to the carrier base 1.

Figure 2:
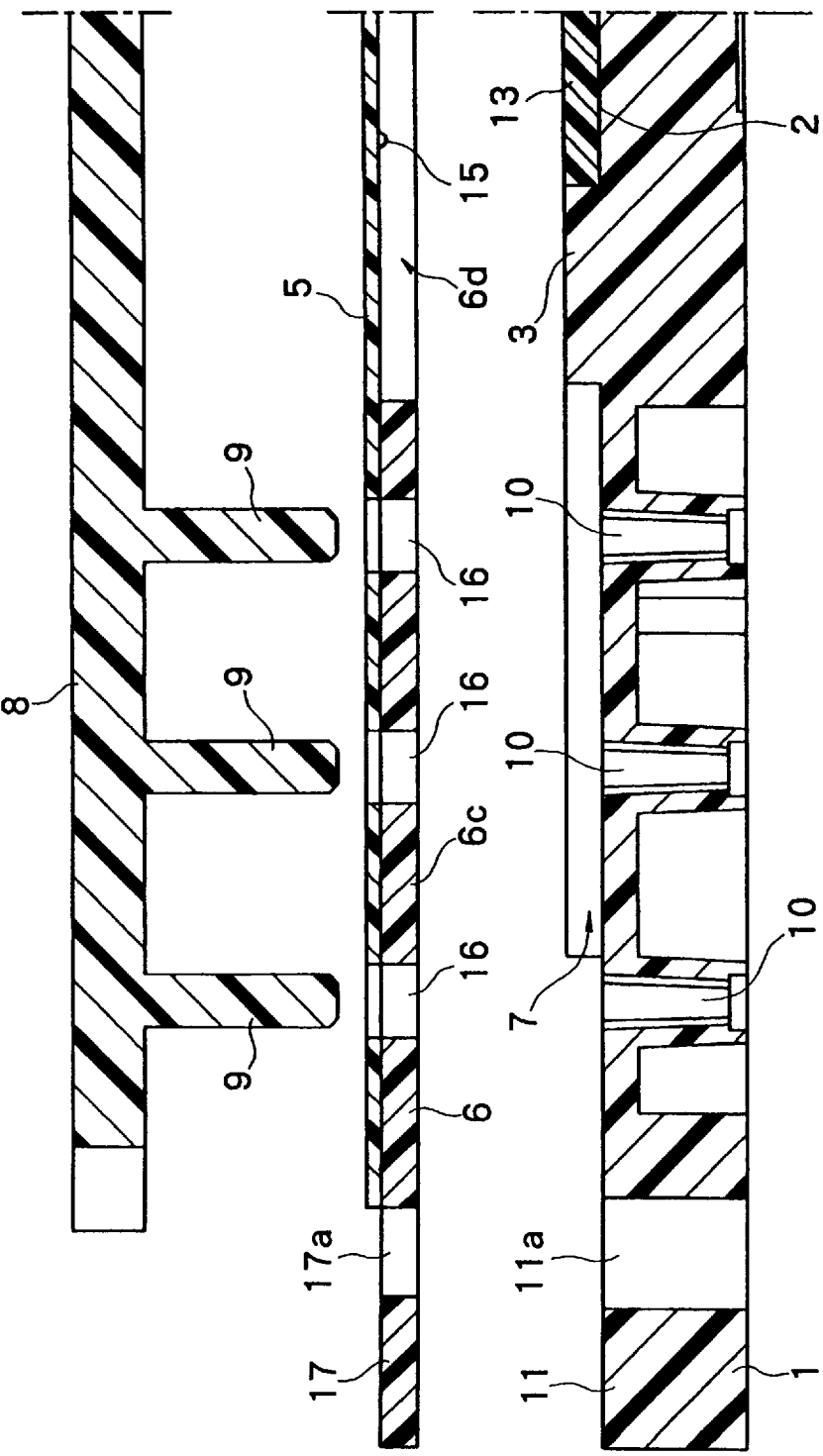
FIG. 2 is a sectional view of FIG. 1.
Figure 11:
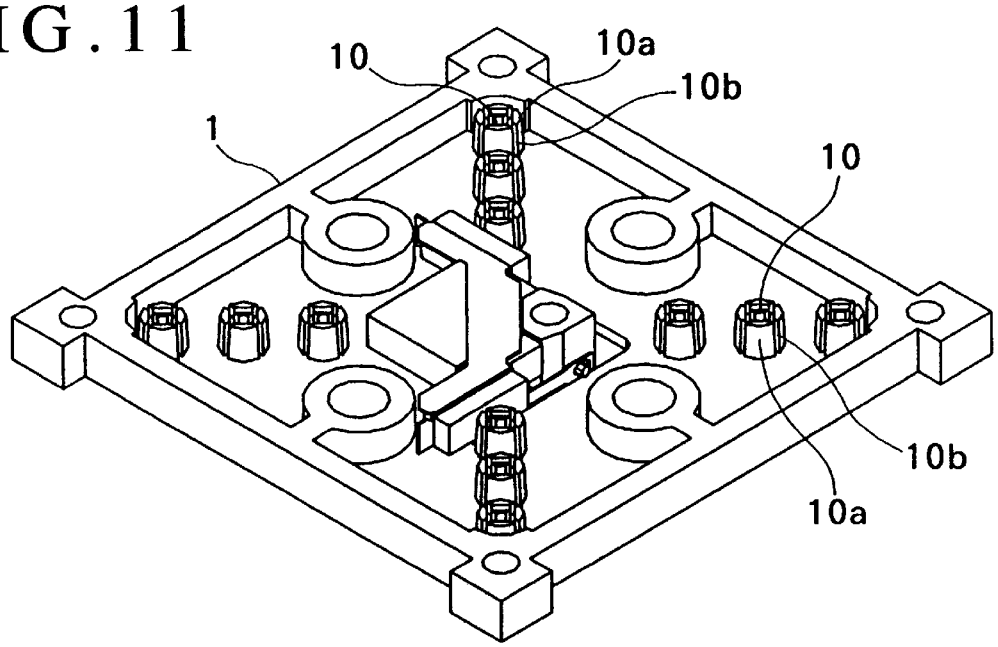
FIG. 11 is a perspective view in which the carrier base is viewed from the back surface side.
Figure 12:
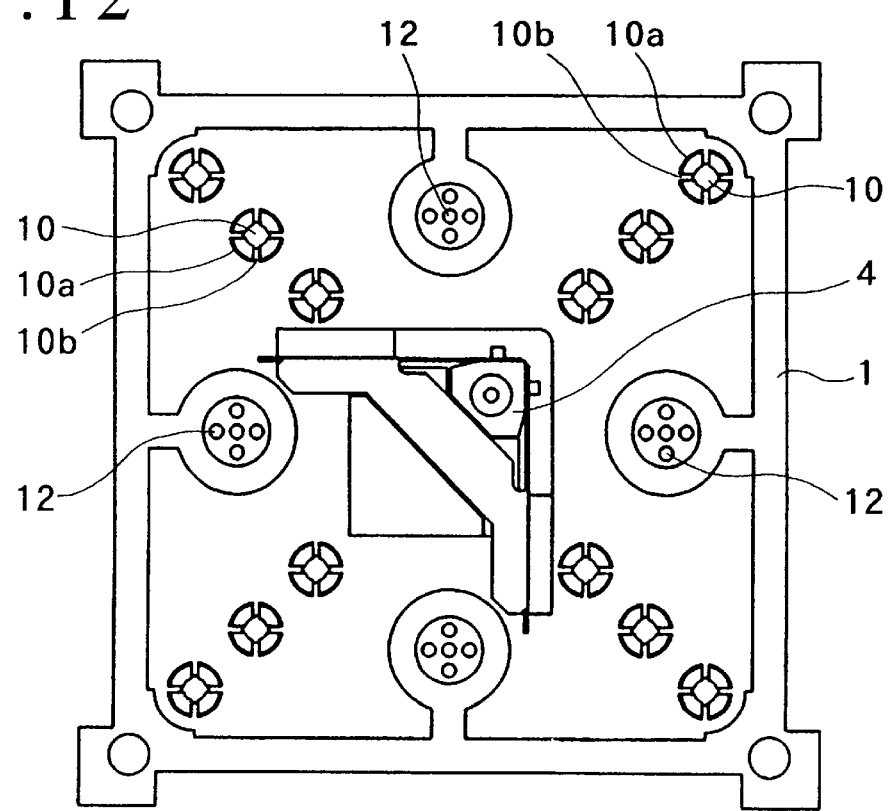
FIG. 12 is a plan view in which the carrier base is viewed from the back surface side.

As shown in FIGS. 2, 11 and 12, each connecting hole 10 is formed of a sleeve member 10a extending towards and projecting from the back surface of the carrier base 1. Slits 10b are formed in each sleeve member 10a in its axial direction, so that the sleeve members 10a can expand and contract through the slits 10b. The connecting pins 9 are inserted into the corresponding connecting holes 10 and are firmly caught therein while forcibly expanding (namely, enlarging the diameter of ) the sleeve members 10a.

As shown in FIG. 1, as well as elsewhere, the movable corner ruler 4 is displaced away from the reference corner ruler 3 against its resiliency and then the IC 13 is inserted into the IC receiving portion 2. Thereafter, the movable corner ruler 4 is returned to its original location under the effect of its resiliency, thereby fixedly retaining the IC 13 on the carrier base 1.

Figure 3:
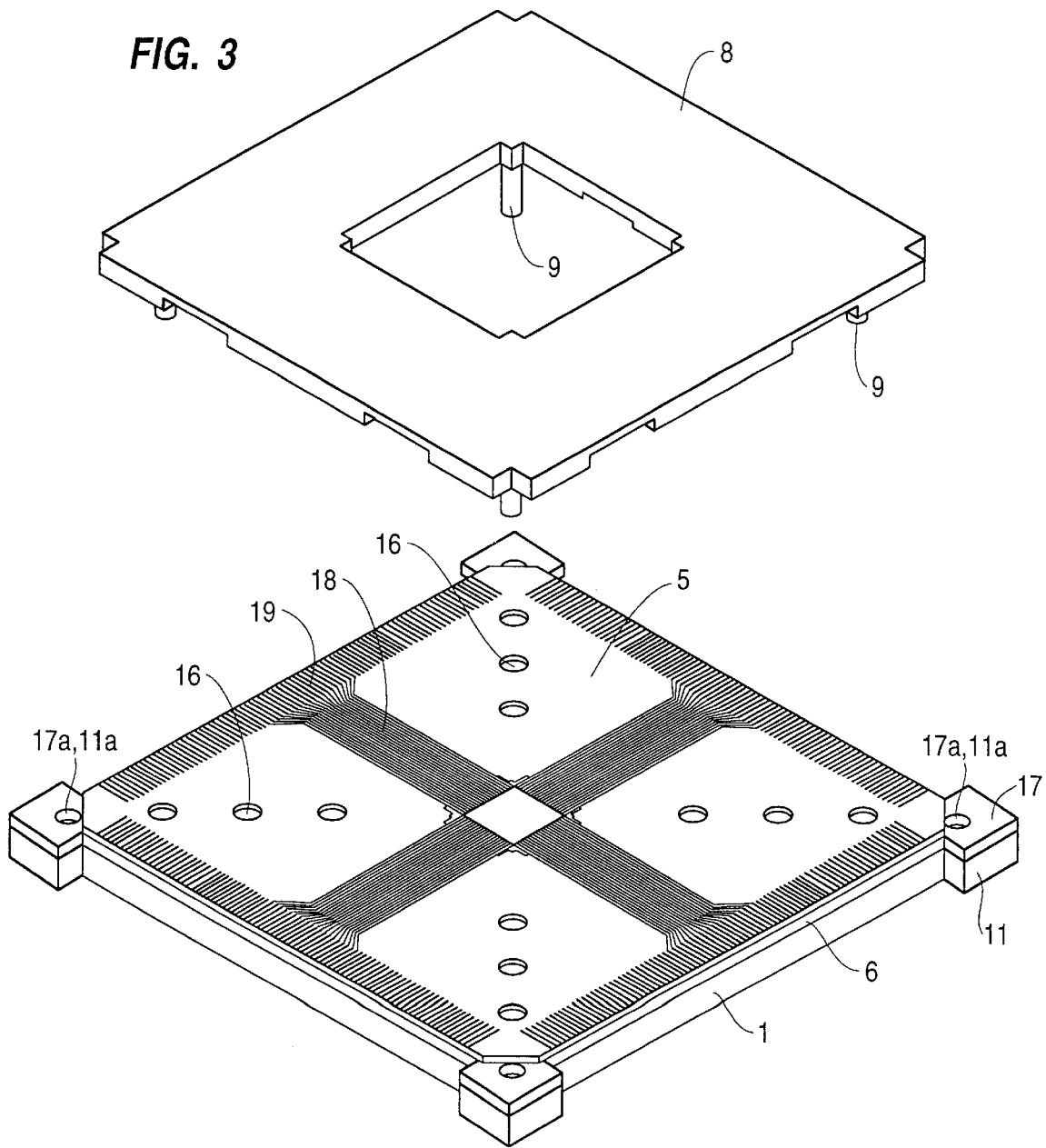
FIG. 3 is a perspective view in which the flexible wiring sheet is superimposed on the carrier base.
Figure 4:
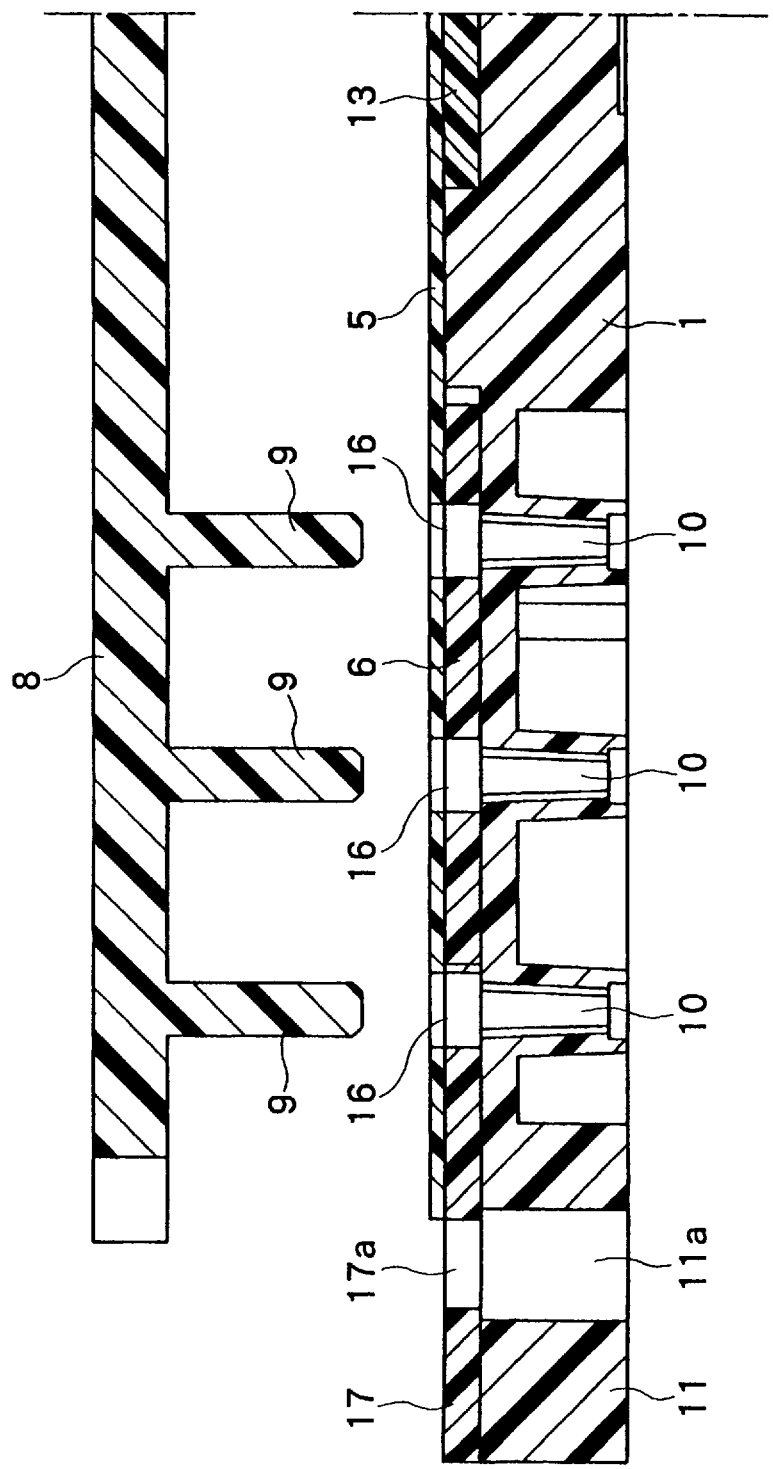
FIG. 4 is a sectional view of FIG. 3.

As shown in FIGS. 3 and 4, the flexible wiring sheet 5 bonded to the backup frame 6 is placed on the surface of the carrier base 1 in a superimposed relation. At that time, the frame portions 6a, 6b and 6c are fitted in the frame receiving portion 7 so that the frame 6 is superimposed on the carrier base 1. This superimposition of the frame 6 on the carrier base 1 aligns the connecting holes 10, the through-holes 16 and the positioning holes 17a, respectively. Furthermore, the suction hole 12 formation areas (namely, the areas where the suction holes 12 are formed) are engaged respectively in openings 6e formed between adjacent connecting frames 6c, the suction holes 12 are caused to face the wiring sheet 5, and the IC 13 is received in the receiving window 6d with the IC contact pieces 14 facing the bumps 15.

First, locations of both the IC 13 and the flexible wiring sheet 5 loaded on the carrier base 1 are accurately measured by a CCD camera or the like, so that the flexible wiring sheet 5 is adjustingly slightly moved to a correct location with respect to the IC 13. After the flexible wiring sheet 5 is placed in the correct location with respect to the IC 13, suction ports of a vacuum pump or the like are connected respectively to the suction holes 12 of the carrier base 1 and a negative pressure is supplied to the flexible wiring sheet 5 so that the above correct location can be maintained by the negative pressure.

Figure 5:
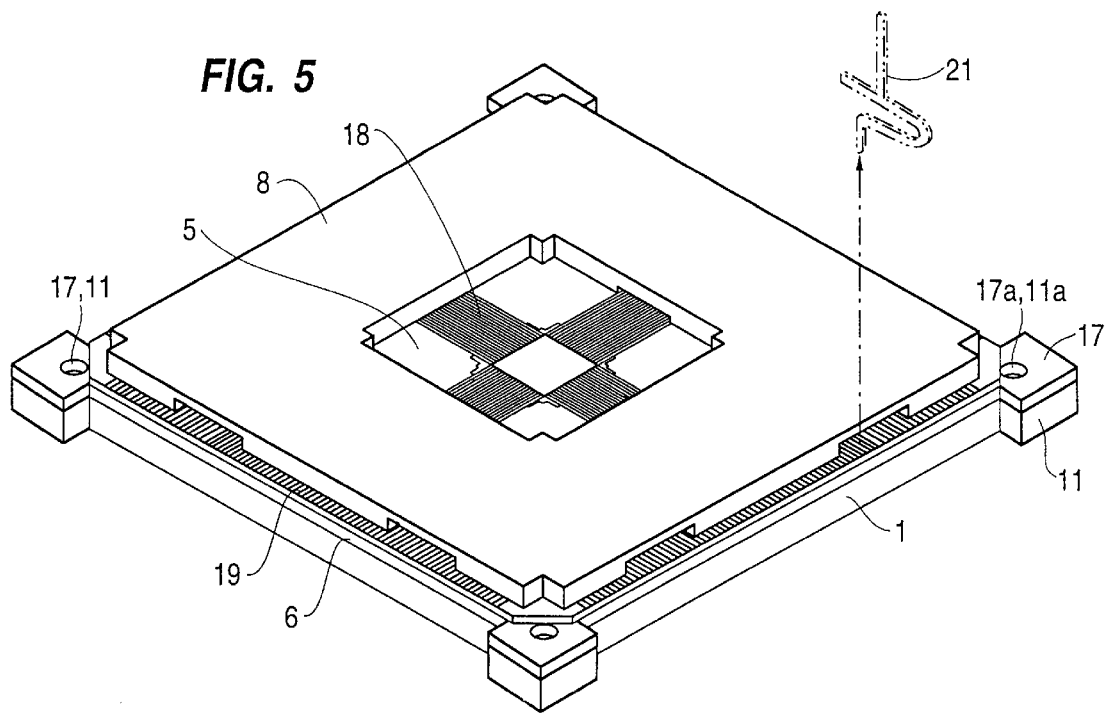
FIG. 5 is a perspective view of a carrier assembly in which the wiring sheet and the cover are superimposed on the carrier base.
Figure 6:
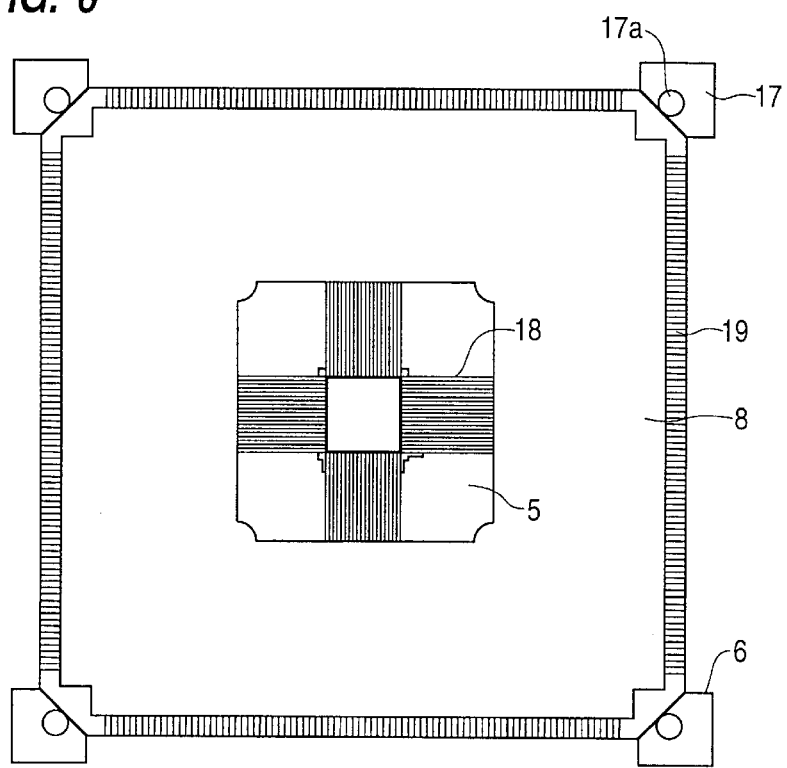
FIG. 6 is a plan view of FIG. 5.
Figure 7:
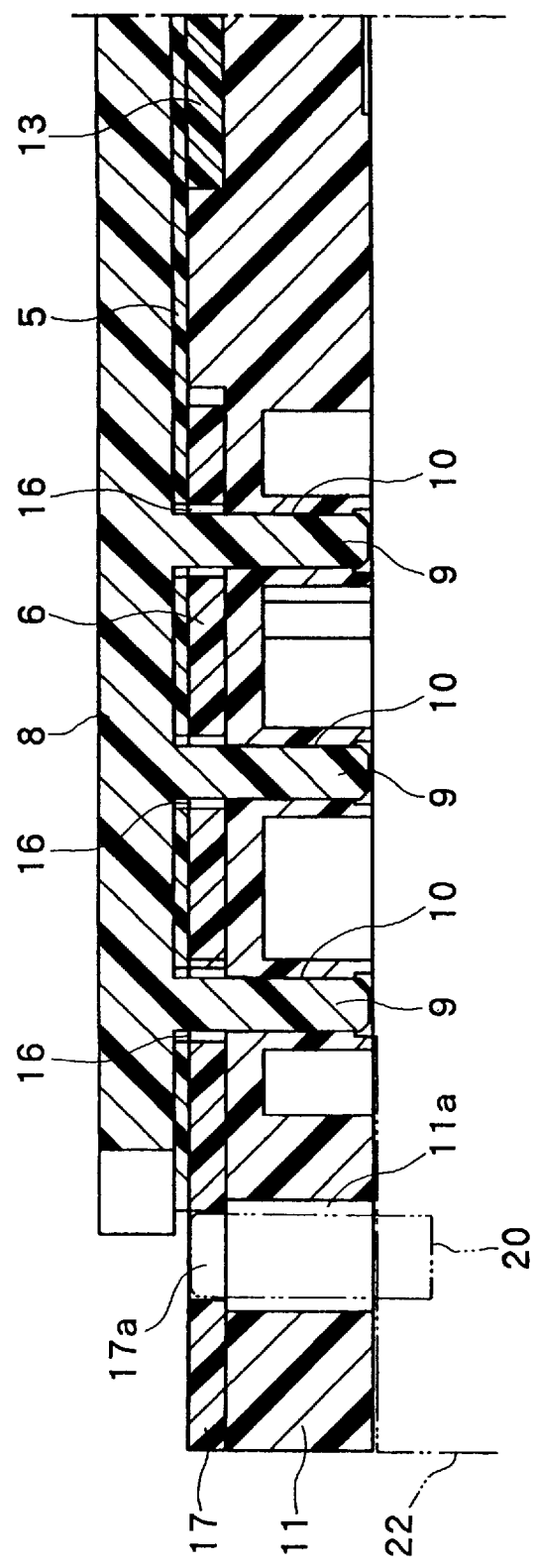
FIG. 7 is a sectional view of FIG. 5.

In that state, as shown in FIGS. 5, 6 and 7, the carrier cover 8 is closed such that the connecting pins 9 of the carrier cover 8 are press fitted into the connecting holes 10 of the carrier holes through the through-holes 16. As a consequence, the flexible wiring sheet 5 is firmly held between the carrier cover 8 and the carrier base 1 together with the backup frame 6 and the correct location of the wiring sheet 5 with respect to the IC is maintained. Thereafter, the supply of the negative pressure is stopped.

As shown in FIGS. 5 and 6, the respective side edge portions of the wiring sheet 5 and the respective side edge portions of the contact pad 19 and backup frame 6 arranged on the side edge portions of the wiring sheet 5 are expanded sidewardly from the side edge portions of the cover 8 so as to be contacted with the contacts 21 of the socket 22.

As described previously, since the through-holes 16 of the flexible wiring sheet 5 are larger than the connecting holes 10 of the carrier base 1, the through-holes 16 are larger than the connecting pins 9 of the carrier cover 8 and as a result, when the carrier cover 8 is closed with respect to the carrier base 1, the connecting pins 9 can be press fitted into the connecting holes 10 of the carrier base 1 without giving any effect to the location of the flexible wiring sheet 5.

As mentioned above, the positioning holes 17a of the backup frame 6 are smaller than the holes 11a of the carrier base 1, and in order to bring the contact pad 19 of the flexible wiring sheet 5 into contact with the IC socket, it is sufficient that the positioning pins 20 of the IC socket are inserted into the positioning holes 17a having a reduced diameter through the holes 11a having an enlarged diameter, so that the flexible wiring sheet 5 can directly and correctly be positioned.

There is a possibility that when a negative pressure is supplied to the flexible wiring sheet 5 from the suction hole 12, the flexible wiring sheet 5 will be deformed by the negative pressure. In order to prevent an occurrence of such an unfavorable situation, each suction hole 12 may consist of a plurality of tiny holes as shown.

As previously mentioned, it is preferred that the connecting pins 9, through-holes 16 and connecting holes 10 are arranged on each diagonal line of the assembly of the carrier base 1, wiring sheet 5 and carrier cover 8. That is, the wiring sheet 5 is provided at its central portion with the contact pad 19 which is something like the bumps 15 with respect to the IC. The pad 19 and the bump 15 are formed on each end of the lead pattern 18 extending from the central portion of the wiring sheet 5 towards the peripheral edge portion.

Accordingly, by arranging the through-holes 16 between adjacent lead patterns extending from the central portion of the wiring sheet 5 towards the respective side edges, in other words, by arranging the through-holes 16 on each diagonal line of the wiring sheet 5, the through-holes 16 can be designed large enough without any interference with the lead patterns 18. As a consequence, the connecting pins 9 can correctly be fitted into the connecting holes 10 on each diagonal line.

In the above-mentioned embodiment, the connecting pins 9 are provided on the carrier cover. However, the present invention should by no means be limited to this embodiment. The connecting pins 9 may be provided on the carrier base 1 and the connecting holes 10 for the connecting pins 9 to be press fitted therein may be provided on the carrier cover 8. In any case, the connecting pins 9 and the connecting holes 10 can be joined together by one action for closing the cover 8 with respect to the base to press the base.

As described hereinbefore, according to the carrier, the flexible wiring sheet is loaded on the carrier base so that the flexible wiring sheet corresponds correctly to the IC on the carrier base by utilizing a CCD camera, a laser microscope or the like. Thereafter, the cover is closed with respect to the base to press the base, so that the connecting pins are press fitted respectively into the connecting holes. As a consequence, the peripheral edge portions of the wiring sheet are firmly held between the base and the cover, so that the correct location of the wiring sheet is positively maintained.

Furthermore, the connecting pins can be press fitted into the connecting holes by one action for closing the cover with respect to the base to press the base, the base, cover and wiring sheet can easily be assembled, and the connecting pins can be press fitted into the connecting holes through the through-holes formed in the wiring sheet. Accordingly, a large clamping force of the wiring sheet by the connecting pins can be obtained in an efficient manner.

It is to be understood that the above-mentioned arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. An IC carrier comprising:

a carrier base;

a carrier cover mounted on said carrier base such that opposing surfaces of said carrier cover and said carrier base, respectively, oppose each other;

a wiring sheet, through which first and second electrical components can contact each other, interposed between said carrier base and said carrier cover;

connecting pins projecting from the opposing surface of one of said carrier cover and said carrier base toward the other of said carrier cover and said carrier base;

wherein connecting holes are formed in the opposing surface of the other of said carrier cover and said carrier base;

wherein through-holes are formed in said wiring sheet, and a peripheral edge portion of said wiring sheet has a contact pad formed thereon to be contacted by contacts of one of the electrical components;

wherein said connecting pins are inserted through said through-holes of said wiring sheet and are press fitted into said connecting holes, respectively;

wherein a backup frame is bonded to said wiring sheet, is interposed between said carrier cover and said carrier base and supports a peripheral edge portion of said wiring sheet; and wherein said backup frame is provided with at least one positioning hole therein into which at least one positioning pin of one of the first and second electrical components can be inserted.

2. An IC carrier as recited in claim 1, wherein the peripheral edge portion of said wiring sheet extends outwardly beyond a peripheral edge of said carrier cover.

3. An IC carrier as recited in claim 1, wherein said through-holes of said wiring sheet are larger in diameter than said connecting pins.

4. An IC carrier as recited in claim 1, wherein said wiring sheet is generally rectangular, and said through-holes of said wiring sheet are formed along a diagonal of said wiring sheet; and said carrier cover and said carrier base are generally rectangular, said connecting pins project from along a diagonal of said one of said carrier cover and said carrier base, and said connecting holes are formed in said other of said carrier cover and said carrier base along a diagonal thereof.

5. An IC carrier as recited in claim 1, wherein said carrier base has at least one positioning hole formed therein for receiving the at least one positioning pin of the one of the first and second electrical components.

6. An IC carrier as recited in claim 5, wherein said at least one positioning hole of said backup frame is smaller in diameter than said at least one positioning hole of said carrier base.

7. An IC carrier as recited in claim 5, wherein said carrier base is generally rectangular; and said at least one positioning hole of said carrier base comprises plural positioning holes formed in respective corners of said carrier base.

8. An IC carrier as recited in claim 7, wherein said at least one positioning hole of said backup frame comprises plural positioning holes, and said positioning holes of said backup frame are smaller in diameter than said positioning holes of said carrier base.

9. An IC carrier as recited in claim 1, wherein said backup frame comprises an outer frame portion, an inner frame portion and connecting frame portions extending along diagonals of said backup frame and connecting said outer frame portion to said inner frame portion.

10. An IC carrier comprising:

a carrier base;

a carrier cover mounted on said carrier base such that opposing surfaces of said carrier cover and said carrier base, respectively, oppose each other;

a wiring sheet, through which first and second electrical components can contact each other, interposed between said carrier base and said carrier cover;

connecting pins projecting from the opposing surface of one of said carrier cover and said carrier base toward the other of said carrier cover and said carrier base;

wherein connecting holes are formed in the opposing surface of the other of said carrier cover and said carrier base;

wherein through-holes are formed in said wiring sheet;

wherein said through-holes are larger in diameter than said connecting pins so as to allow play between said connecting pins and peripheral edges of said through-holes, respectively; and wherein said connecting pins are inserted through said through-holes of said wiring sheet and are press fitted into said connecting holes.

11. An IC carrier as recited in claim 10, wherein the peripheral edge portion of said wiring sheet extends outwardly beyond a peripheral edge of said carrier cover.

12. An IC carrier as recited in claim 10, wherein said wiring sheet is generally rectangular, and said through-holes of said wiring sheet are formed along a diagonal of said wiring sheet; and said carrier cover and said carrier base are generally rectangular, said connecting pins project from along a diagonal of said one of said carrier cover and said carrier base, and said connecting holes are formed in said other of said carrier cover and said carrier base along a diagonal thereof.

13. An IC carrier as recited in claim 10, wherein said carrier base has at least one positioning hole formed therein for receiving the at least one positioning pin of the one of the first and second electrical components.

14. An IC carrier as recited in claim 13, wherein a backup frame is bonded to said wiring sheet, and said backup frame has at least one positioning hole formed therein and aligned with said at least one positioning hole of said carrier base; and said at least one positioning hole of said backup frame is smaller in diameter than said at least one positioning hole of said carrier base.

15. An IC carrier as recited in claim 13, wherein said carrier base is generally rectangular; and said at least one positioning hole of said carrier base comprises plural positioning holes formed in respective corners of said carrier base.

16. An IC carrier as recited in claim 15, wherein a backup frame is bonded to said wiring sheet, and said backup frame is provided with positioning holes in respective corner portions and aligned with said positioning holes of said carrier base, respectively; and said positioning holes of said backup frame are smaller in diameter than said positioning holes of said carrier base.

* * * * *